United States Patent
Hwang

(10) Patent No.: US 7,929,350 B2
(45) Date of Patent: Apr. 19, 2011

(54) NONVOLATILE MEMORY DEVICE, OPERATING METHOD THEREOF, AND MEMORY SYSTEM INCLUDING THE SAME

(75) Inventor: Sangwon Hwang, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 57 days.

(21) Appl. No.: 12/542,882

(22) Filed: Aug. 18, 2009

(65) Prior Publication Data
US 2010/0067306 A1    Mar. 18, 2010

(30) Foreign Application Priority Data
Sep. 16, 2008   (KR) .................. 10-2008-0090752

(51) Int. Cl.
G11C 16/04 (2006.01)
(52) U.S. Cl. .......... 365/185.19; 365/185.02; 365/185.03

(58) Field of Classification Search ............... 365/185.02
See application file for complete search history.

(56) References Cited

U.S. PATENT DOCUMENTS

| 7,038,949 B2 * | 5/2006 | Chae et al. ............... 365/185.23 |
| 7,339,834 B2 | 3/2008 | Lutze |
| 2004/0015649 A1 | 1/2004 | Chang |
| 2008/0084749 A1 | 4/2008 | Lee et al. |

FOREIGN PATENT DOCUMENTS

| JP | 2004-055110 | 2/2004 |
| KR | 1020040008532 A | 1/2004 |
| KR | 1020080016598 A | 2/2008 |
| KR | 1020080032765 A | 4/2008 |

* cited by examiner

*Primary Examiner* — Tan T. Nguyen
(74) *Attorney, Agent, or Firm* — Voletine & Whitt, PLLC

(57) ABSTRACT

A nonvolatile memory device includes a memory cell array; a voltage generator configured to provide stepwise increasing step pulses for varying logic states of memory cells in the memory cell array; and control logic configured to adjust an initial voltage of the stepwise increasing step pulses according to the number of the stepwise increasing step pulses.

20 Claims, 10 Drawing Sheets

NONVOLATILE MEMORY DEVICE, OPERATING METHOD THEREOF, AND MEMORY SYSTEM INCLUDING THE SAME

A claim for priority under 35 U.S.C §119 is made to Korean Patent Application No. 10-2008-0090752, filed on Sep. 16, 2008, the entirety of which is hereby incorporated by reference.

BACKGROUND OF THE INVENTION

1. Field of the Invention

The present invention relates to a semiconductor memory device, and more particularly, the present invention relates to a nonvolatile memory device, an operating method thereof, and a memory system including the same.

2. Description of the Related Art

Semiconductor memory devices are storage devices that store data and output the stored data as needed. Semiconductor memory devices may be characterized as either volatile memory devices or nonvolatile memory devices. A volatile memory device is a memory device which loses its stored data when power to the device is cut off. Examples of volatile memory devices include SRAM, DRAM, SDRAM, and the like. A nonvolatile memory device is a memory device which retains its stored data even in the event that power to the device is cut-off. Examples of nonvolatile memory devices include ROM, PROM, EPROM, EEPROM, flash memory device, PRAM, MRAM, RRAM, FRAM, and the like. In general, a flash memory device can be characterized as either being a NOR type or a NAND type.

A nonvolatile memory device includes a plurality of nonvolatile memory cells. Repetitive program/erase operations of the nonvolatile memory device eventually cause deterioration of nonvolatile memory cells, thus changing its operating properties. As operating properties and reliability of nonvolatile memory devices are lowered due to deterioration of the nonvolatile memory cells, operating speed of the nonvolatile memory devices may also be lowered. Thus, an object of the invention is to secure read margin, prevent read errors and improve operating speed of a nonvolatile memory device.

SUMMARY OF THE INVENTION

The above and other objects are achieved by providing a nonvolatile memory device which includes a memory cell array; a voltage generator configured to provide stepwise increasing step pulses for varying logic states of memory cells in the memory cell array; and a control logic configured to adjust an initial voltage of the stepwise increasing step pulses according to a number of the stepwise increasing step pulses provided.

The above and other objects are also achieved by further providing an operating method of a nonvolatile memory device which includes supplying memory cells with stepwise increasing step pulses for varying logic states of the memory cells; comparing a number of the stepwise increasing step pulses supplied for varying the logic states of the memory cells with a number of step pulses needed for an operation of the nonvolatile memory device; and adjusting an initial voltage of the stepwise increasing step pulses according to a comparison result.

The above and other objects may also be achieved by still further providing a memory system which includes a nonvolatile memory device; and a controller configured to control the nonvolatile memory device, wherein the nonvolatile memory device includes a memory cell array, a voltage generator configured to provide stepwise increasing step pulses for varying logic states of memory cells in the memory cell array, and a control logic configured to adjust an initial voltage of the stepwise increasing step pulses according to a number of the stepwise increasing step pulses provided.

BRIEF DESCRIPTION OF THE FIGURES

The above and other objects and features will become apparent with reference to the following figures, wherein like reference numerals refer to like parts throughout the various figures unless otherwise specified, and wherein.

DETAILED DESCRIPTION OF THE EMBODIMENTS

A nonvolatile memory device according to the various embodiments may include a memory cell array, a voltage generator for providing stepwise increasing step pulses for varying logic states of memory cells in the memory cell array, and control logic for controlling an initial voltage of the stepwise increasing step pulses according to the number of the stepwise increasing step pulses applied to vary logic states of memory cells. The various embodiments will hereinafter be more fully described with reference to accompanying drawings. The inventive concept may however be embodied in different forms and should not be construed as limited to the embodiments set forth herein. Rather, these embodiments are provided so that this disclosure will be thorough, and will fully convey the scope of the embodiments to those skilled in the art.

Figure 1:
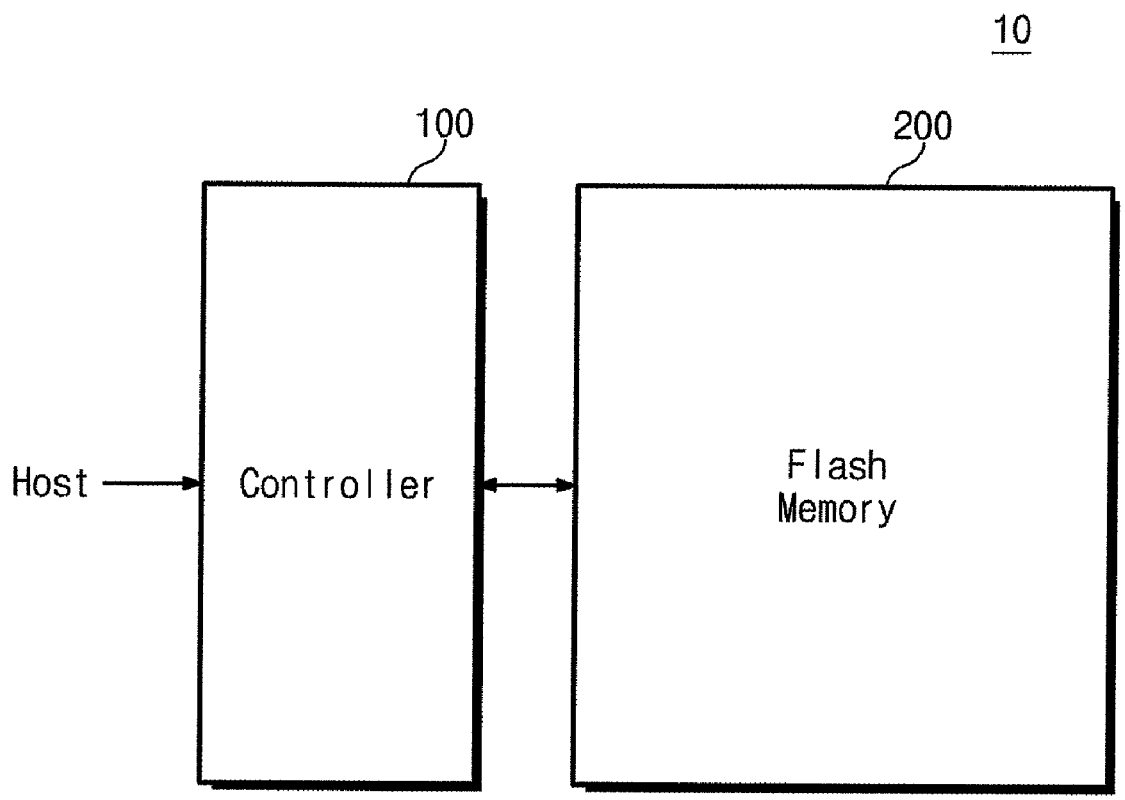
FIG. 1 is a block diagram showing a memory system.

FIG. 1 is a block diagram showing a memory system according to the various embodiments. Referring to FIG. 1, a memory system 10 may include a nonvolatile memory device 200 and a controller 100.

The nonvolatile memory device 200 may include a memory cell array, a voltage generator for providing stepwise increasing step pulses for varying logic states of memory cells in the memory cell array, and control logic for controlling an initial voltage of the stepwise increasing step pulses according to the number of the stepwise increasing step pulses applied to vary the logic states of the memory cells. The nonvolatile memory device will hereinafter be more fully described with reference to FIGS. 2 to 10.

The controller 100 shown in FIG. 1 may be connected with a host (not shown) and the nonvolatile memory device 200. The controller 100 reads data from the nonvolatile memory device 200 and transfers the read data to the host. The controller 100 also receives data transferred from the host and stores the received data in the nonvolatile memory device 200. The controller 100 may include constituent elements such as RAM, a processing unit, a host interface, a memory interface, and the like. For example, the RAM may be used as an operating memory of the processing unit. The processing unit may control an overall operation of the controller 100. The host interface may include a protocol for exchanging data between the host and the controller 100. In exemplary embodiments, the controller 100 may be configured to communicate with one of various interface protocols such as Universal Serial Bus (USB), Multi Media Card (MMC), Peripheral Component Interconnect Bus Express (PCI-E), Advanced Technology Attachment (ATA), Serial-ATA (SATA), Parallel-ATA (PATA), Small Computer System Interface (SCSI), Enhanced Small Device Interface (ESDI), Integrated Drive Electronics (IDE), and the like. The memory interface may interface with the nonvolatile memory device 200. The controller 100 may further include an error correcting block, which detects an error of data read from the nonvolatile memory device 200 and corrects the detected error.

The controller 100 and the nonvolatile memory device 200 can be integrated into one semiconductor device. The controller 100 and the nonvolatile memory device 200 may be integrated to form a memory card. For example, the controller 100 and the nonvolatile memory device 200 may be integrated into one semiconductor device to form a PC card (originally PCMCIA or PCMCIA card), a Compact Flash (CF) card, a Smart Media (SM) Card, a memory stick, a Multi Media Card (MMC, RS-MMC, MMCmicro), a Secure Digital card (SD, miniSD, microSD), a Universal Flash storage (UFS), and the like. The controller 100 and the nonvolatile memory device 200 may be integrated into one semiconductor device to form a Solid State Disk/Drive (SSD). In the case where the memory system 10 is used as an SSD, an operating speed of a host connected with the memory system 10 becomes higher.

Figure 2:
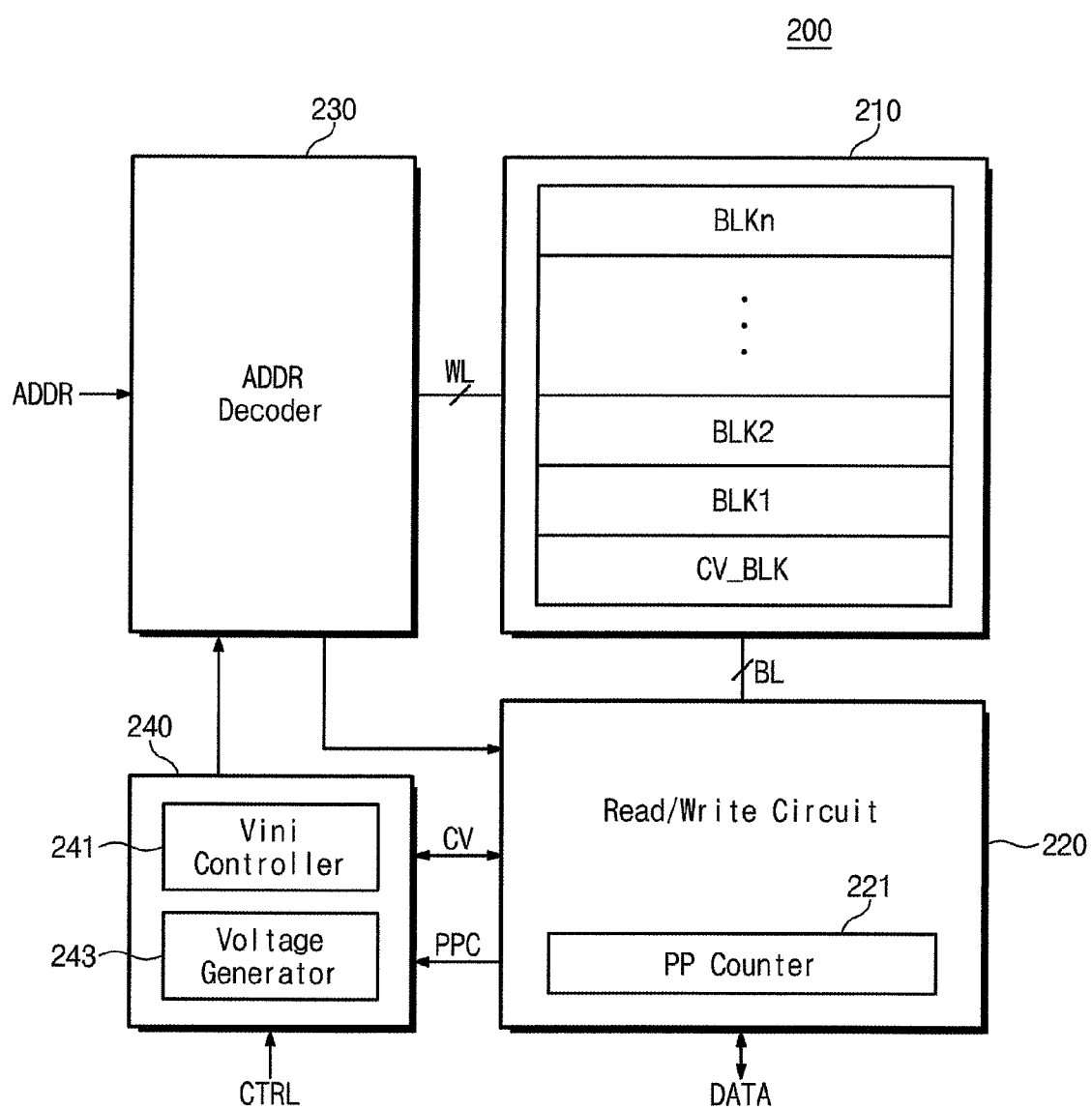
FIG. 2 is a block diagram showing a nonvolatile memory device of the memory system shown in FIG. 1, according to an embodiment of the invention.

FIG. 2 is a block diagram showing a nonvolatile memory device 200 of the memory system 10 of FIG. 1. Referring to FIG. 2, the nonvolatile memory device 200 may include a memory cell array 210, a read/write circuit 220, an address decoder 230, and control logic 240.

The memory cell array 210 is connected to the read/write circuit 220 via bit lines BL, and to the address decoder 230 via word lines WL. The memory cell array 210 may include a plurality of nonvolatile memory cells. Data transferred from the read/write circuit 220 is stored in nonvolatile memory cells of the memory cell array 210.

The nonvolatile memory cells of the memory cell array 210 may be variable resistance memory cells each having a phase change material and set to a resistance value varied according to an applied temperature. As an alternative, the nonvolatile memory cells of the memory cell array 210 may be variable resistance memory cells which are set to a resistance value varied according to a magnetic filed. As a still further alternative, the nonvolatile memory cells of the memory cell array 210 may be ferroelectric memory cells each storing data according to a polarization state varied when a given voltage is applied to the ferroelectric memory cells. Also, the nonvolatile memory cells of the memory cell array 210 may be formed to store data by accumulating/capturing charge in a charge storing layer (e.g., formed of conductor or insulator) according to a given voltage.

The memory cell array 210 may include a plurality of memory blocks BLK1 to BLKn, each of which has a plurality of nonvolatile memory cells. The memory cell array 210 of the nonvolatile memory device 200 may further comprise a storage space CV_BLK for storing a control value CV. In FIG. 2, the storage space CV_BLK is illustrated to be a separate memory block. However, the control value CV is not limited to be stored in a separate memory block. For example, the control value CV can be stored in memory blocks BLK1 to BLKn.

The read/write circuit 220 may select bit lines BL in response to a decoded address from the address decoder 230. The read/write circuit 220 may select bit lines BL in response to a decoded column address from the address decoder 230. The read/write circuit 220 may operate in response to the control of the control logic 240.

The read/write circuit 220 of the nonvolatile memory device 210 may include a Program Pulse (PP) counter 221. The PP counter 221 may count the number of stepwise increasing step pulses applied to the memory cell array 210 during a program operation. For example, if four step pulses are applied until memory cells of the memory cell array 210 are passed as programmed, a value counted by the PP counter 221 would be 4.

The read/write circuit 220 may read a control value CV from the memory cell array 210. In particular, the read/write circuit 220 may read the control value CV from the memory cell array during a read operation which is carried out at the time the system is powered-on. As an alternative, the read/write circuit 220 may read the control value CV from the memory cell array 210 in response to control by control logic 240. The read/write circuit 220 may output the control value CV read from the memory cell array 210 and a program pulse count value PPC of the PP counter 221 to control logic 240.

The read/write circuit 220 may exchange data with an external device. In particular, the read/write circuit 220 may exchange data with controller 100 in FIG. 1. The read/write circuit 220 may write data transferred from the controller 100 into the memory cell array 210, and may transfer data read from the memory cell array 210 to the controller 100. The read/write circuit 220 may include elements for performing read and write operations. The read/write circuit 220 may include elements such as a page buffer, a column pass gate, a data buffer, and the like. As an alternative, the read/write circuit 221 may include elements such as a write driver, a sense amplifier, a data buffer, and the like.

In FIG. 2, the PP counter 221 is illustrated as an element of the read/write circuit 220. However, the PP counter 221 is not limited as an element of the read/write circuit 220. As an alternative, the PP counter 221 can be incorporated in the control logic 240 or the address decoder 230. As a further alternative, the PP counter 221 can be incorporated in function blocks different from the function blocks illustrated in FIG. 2. Also, it should be understood that the PP counter 221 can be formed independently of the function blocks illustrated in FIG. 2. That is, it should be understood that a location of the PP counter 221 is not limited to placement as shown in FIG. 2. Regardless of the location, the PP counter 221 must perform the function of counting the number of program pulses applied during a program operation.

The address decoder 230 may receive an address ADDR from an external device. In particular, the address decoder 230 may receive an address ADDR provided from controller 100 of FIG. 1. The address decoder 230 may decode the address ADDR to select word lines WL and supply a decoded address to the read/write circuit 220. The address decoder ADDR may include a row decoder for decoding a row address and a column decoder for decoding a column address. The address decoder 230 may supply the memory cell array 210 via the word lines WL with a program voltage/current provided from the control logic 240 for a program operation. The address decoder 230 may operate responsive to the control of the control logic 240.

The control logic 240 is connected to the read/write circuit 220 and the address decoder 230. The control logic 240 may be configured to control an overall operation of the nonvolatile memory device 200. The control logic 240 may operate responsive to a control signal CTRL from an external device. Control signal CTRL may be provided from controller 100 of FIG. 1.

The control logic 240 may be configured to store a control value CV transferred from the read/write circuit 220. The control logic 240 may be configured to store the control value CV from the read/write circuit 220 during a read operation which is conducted when the system is powered-on. As an alternative, the control logic 240 may be configured to control the read/write circuit 220 to read the control value CV and store the read control value CV transferred from the read/write circuit 220. The control logic 240 may also receive the program pulse count value PPC from the PP counter 221.

The control logic 240 may include an initial voltage controller 241 and a voltage generator 243. The initial voltage controller 241 may compare the control value CV and the program pulse count value PPC to control an initial voltage Vini. In particular, the initial voltage controller 241 may control a program initial voltage Vini_p.

The voltage generator 243 may generate voltages for execution of a program operation. The voltage generator 243 may generate a stepwise increasing step pulse to be provided to the address decoder 230. For example, the voltage generator 243 may generate a stepwise increasing program pulse, which is stepwise increased from a program initial voltage Vini_p.

Figure 3:
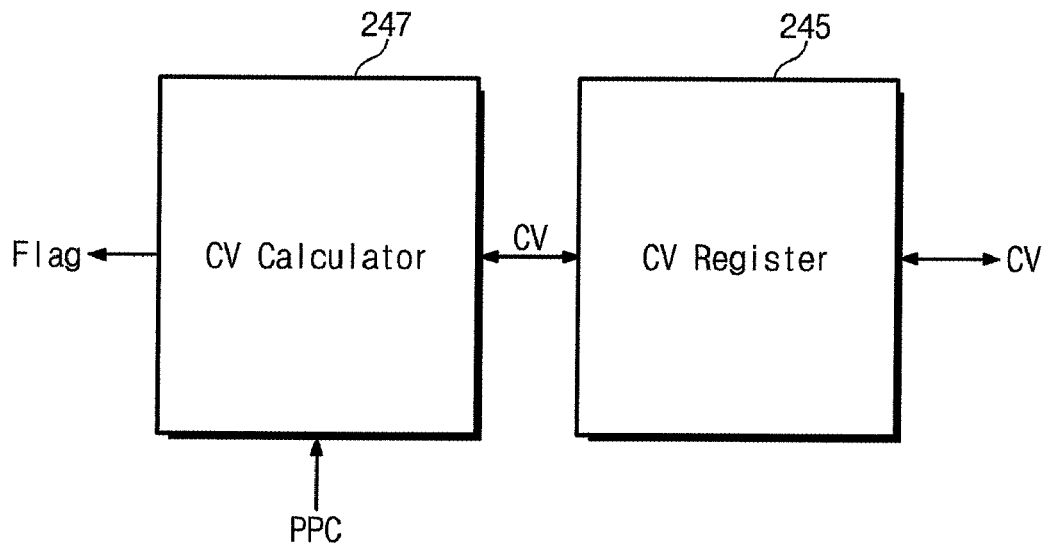
FIG. 3 is a block diagram showing details of an initial voltage controller of FIG. 2.

FIG. 3 is a block diagram showing details of an initial voltage controller 241 of FIG. 2. As shown, initial voltage controller 241 may include a control value register 245 and a control value calculator 247. The control value register 245 may store a control value CV transferred from a read/write circuit 220 of FIG. 2. The control value calculator 247 may receive the control value CV from the control value register 245 and a program pulse count value PPC from the read/write circuit 220. The control value calculator 247 may compare the received values CV and PPC to generate a flag signal Flag.

Figure 4:
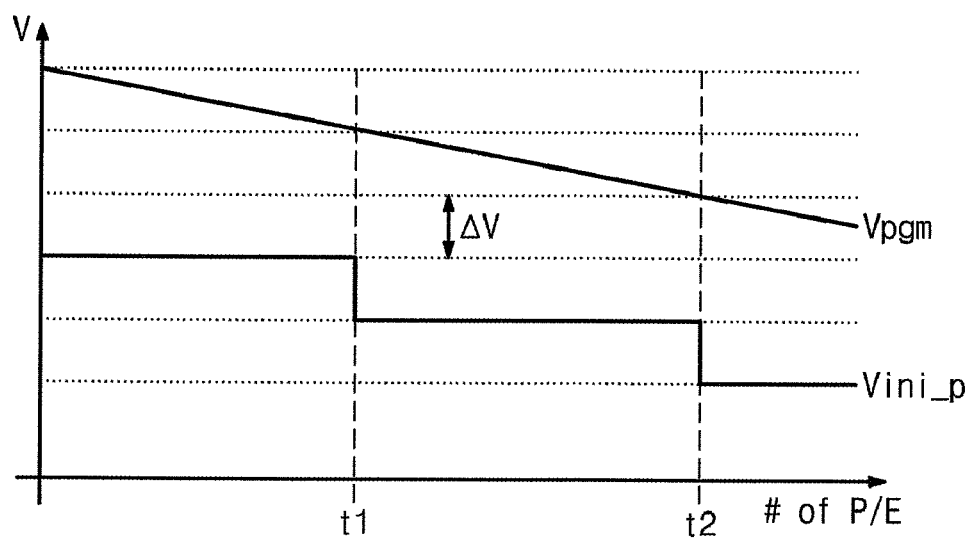
FIG. 4 is a diagram for describing operation of the nonvolatile memory device.

FIG. 4 is a diagram for describing operation of the nonvolatile memory device 200 of FIG. 2. In FIG. 4, the horizontal axis indicates a program/erase number, and the vertical axis indicates a voltage. Operation of the nonvolatile memory device 200 will hereinafter be more fully described with reference to FIGS. 2 to 4.

During a program/erase operation, the nonvolatile memory device 200 may perform a program/erase operation using a stepwise increasing step pulse. As a program/erase operation is repeated over time, a voltage level required for the program/erase operation can be varied. In the case of a flash memory device, charge is accumulated at an insulating film between a charge storing layer and a substrate. In this case, a voltage level required to program flash memory cells is lowered, while a voltage level required to erase flash memory cells is increased. Similar to flash memory devices, other nonvolatile memory devices such as PRAM, RRAM, MRAM, EEPROM, etc. may suffer from such a phenomenon that a voltage level required for a program/erase operation is varied due to deterioration of memory cells.

The nonvolatile memory device 200 of this embodiment is configured to compensate for variation of voltage level required for a program/erase operation, the variation caused due to repetition of the program/erase operation. This will be hereinafter described in more detail as follows.

In FIG. 4, a line Vpgm indicates a voltage level required at a program operation, and a line Vini_p indicates an initial voltage of a stepwise increasing program pulse. $\Delta V$ indicates an increment of the program pulse. In FIG. 4, the program pulse is stepwise increased by $\Delta V$ from the program initial voltage Vini_p. If the program pulse is stepwise increased three times from the program initial voltage Vini_p, it reaches the program voltage Vpgm. In FIG. 4, the program pulse is illustrated to be stepwise increased three times. However, it should be understood that the number of the program pulses is not limited as disclosed above.

A level of a program voltage Vpgm required at a program operation decreases according to repetitive program/erase operations. In a case where a program/erase number reaches a point of time t1, the program initial voltage reaches the program voltage Vpgm if the program pulse is stepwise increased twice. That is, the number of program pulses applied at a program operation is reduced from 3 to 2. If the number of program pulses is reduced, a threshold voltage distribution of programmed memory cells is widened. This causes a decrease in read margin, thus generating read error.

In the case of a conventional flash memory device, although memory cells are deteriorated, a program initial voltage is set such that program pulses over a given number are applied to memory cells. That is, although a program voltage Vpgm is lowered due to deterioration of memory cells, a program initial voltage is set to a low level. This means that program pulses over a given number are applied to memory cells. If a program initial voltage is set to a low level, the number of program pulses applied to memory cells when memory cells are not deteriorated sufficiently, is more than the number of program pulses applied to memory cells when memory cells are deteriorated sufficiently. That is, a program time increases when a program initial voltage is set to a low level as compared to the case that memory cells are deteriorated.

The nonvolatile memory device 200 according to this embodiment increases read margin, prevents/reduces read error, and reduces a program time, by maintaining the number of program pulses applied at program operations. In this embodiment, the nonvolatile memory device 200 maintains the number of program pulses by adjusting/controlling a program initial voltage Vini_p.

The control value calculator 247 of FIG. 3 may compare a control value CV and a program pulse count value PPC. The control value CV may indicate the number of program pulses needed at a program operation. For example, the control value CV may be the number of program pulses for programming memory cells so that a threshold voltage distribution of the memory cells exists within a given range. For convenience of description, it is assumed that the number of program pulses needed at a program operation is 3. That is, it is assumed that the control value CV is 3. However, it should be understood that the number of program pulses is not limited to 3.

As illustrated in FIG. 4, if nonvolatile memory cells are deteriorated due to repetition of program/erase operations, a reduced program voltage Vpgm is needed at a program operation. At t1, the number of program pulses applied at a program operation is reduced from 3 to 2 due to reduction of the program voltage Vpgm. That is, a program pulse count value PPC is reduced to 2 from 3. On the other hand, control value register 245 may store a value of 3 as a control value CV. If the control value CV and the program pulse count value PPC are different from each other, control value calculator 247 may generate a flag signal Flag. When the flag signal Flag is generated, voltage generator 243 may reduce an initial voltage Vini_p of a program pulse. In this embodiment, voltage generator 243 reduces an initial voltage Vini_p of a program pulse by $\Delta V$.

As should be understood in FIG. 4, if a program initial voltage Vini_p is lowered at t1, the number of program pulses is increased from 2 to 3. That is, the number of program pulses would then be maintained as identical before and after t1. Thus, read margin becomes improved, and read error is prevented or reduced.

As should be further understood in view of FIG. 4, at t2 the number of program pulses needed at a program operation is reduced from 3 to 2. Accordingly, the control value calculator 247 generates the flag signal Flag, and the voltage generator 243 reduces a program initial voltage Vini_p. As a result, the number of program pulses would be maintained as identical before and after t2. Thus, read margin becomes improved, and read error is prevented or reduced.

As described above, the nonvolatile memory device 200 is configured to maintain the number of program pulses constant even though program/erase operations are repeated. This means that a program time is reduced.

The control value CV may additionally include information corresponding to a program initial voltage Vini_p. Between t1 and t2, the program initial voltage Vini_p is reduced once from an initial level. The control value CV may include information corresponding to the number reduced from the initial level. During a read operation conducted at power-on (hereinafter referred to as a power-on read operation), the control value calculator 247 may adjust the program initial voltage Vini_p with reference to the control value CV. In the case that the program initial voltage Vini_p is changed due to repetition of program/erase operations, the control value calculator 247 may update the control value CV in the control value register 245. Control logic 240 of FIG. 2 may update a control value CV within storage space CV_BLK.

As an alternative, it should be understood that the control value CV may be stored in nonvolatile control value register 245 instead of in memory cell array 210.

The voltage generator 243 may vary a program initial voltage Vini_p, for example, using a well-known voltage trim circuit. In the case where a trim circuit for varying a program initial voltage Vini_p stores its level as nonvolatile information using electric fuses, it would be sufficient for the control value CV to indicate the number of program pulses needed at a program operation. That is, information corresponding to a program initial voltage Vini_p is not required. In such a case, the control value CV may be information indicative of the number of program pulses needed at a program operation, and such information is maintained constantly. Accordingly, control value register 245 may be replaced with a circuit that generates a value corresponding to the number of program pulses needed at a program operation.

Figure 5:
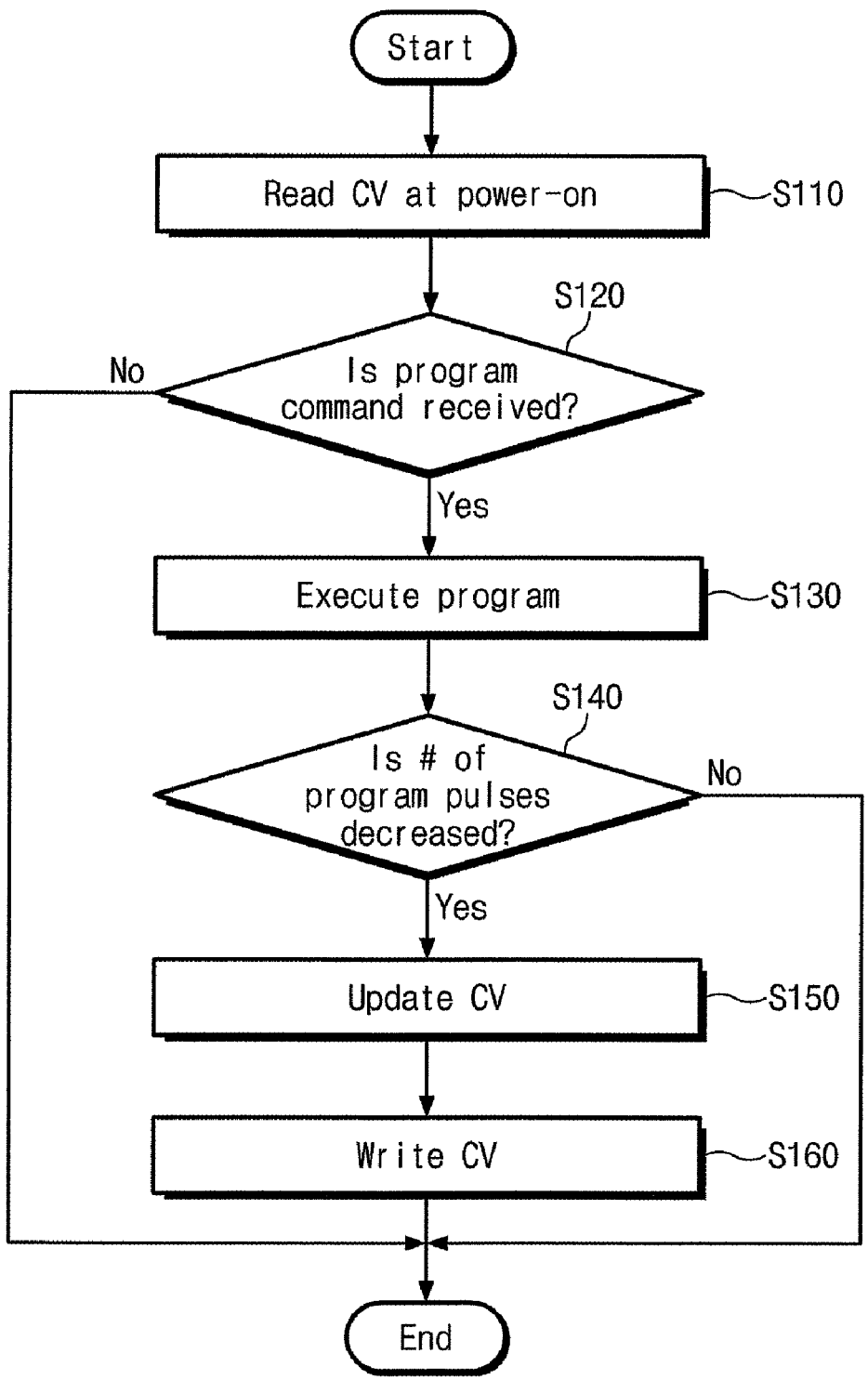
FIG. 5 is a flowchart for describing an operation of the nonvolatile memory device.

FIG. 5 is a flowchart for describing an operation of the nonvolatile memory device of FIG. 2. Referring to FIGS. 2 to 5, in step S110 a control value CV is read out from a memory cell array 210 during a power-on read operation. The control value CV is stored in control value register 245 of control logic 240.

If a program command is received in step S120, the procedure advances to step S130, in which a program operation is executed. An initial voltage generator 241 sets up a program initial voltage Vini_p in response to a control value CV. A voltage generator 243 generates program pulses which are stepwise increased from the program initial voltage Vini_p. At this time, PP counter 221 of read/write circuit 220 counts the number of program pulses applied to memory cell array 210.

In step S140, it is judged whether the number of program pulses is reduced. A control value calculator 247 compares the control value CV and the program pulse count value PPC. If the control value CV is more than the program pulse count value PPC, the control value calculator 247 generates a flag signal Flag, and the procedure advances to Step S150. On the other hand, upon determination in Step S140 that the number of pulses is not decreased, the operation is ended.

In step S150, the control value CV is updated. The initial voltage controller 241 adjusts the program initial voltage Vini_p in response to the flag signal Flag. Control logic 240 updates the control value CV, and the updated control value indicates that the program initial voltage Vini_p is adjusted.

In step S160, the updated control value CV is written into memory cell array 210. The control logic 240 may write the control value CV into the memory cell array 210 at a power-off operation. As an alternative, the control logic 240 may write the control value CV in the memory cell array 210 whenever the control value CV is updated.

As described above, the nonvolatile memory device 200 according to this embodiment includes a memory cell array 210, a voltage generator 243 for providing stepwise increasing step pulses for changing logic states of memory cells in the memory cell array 210, and control logic 240 for adjusting an initial voltage of the stepwise increasing step pulses according to the number of the step pulses. Read margin is thus secured, and read error is consequently prevented or reduced.

Figure 6:
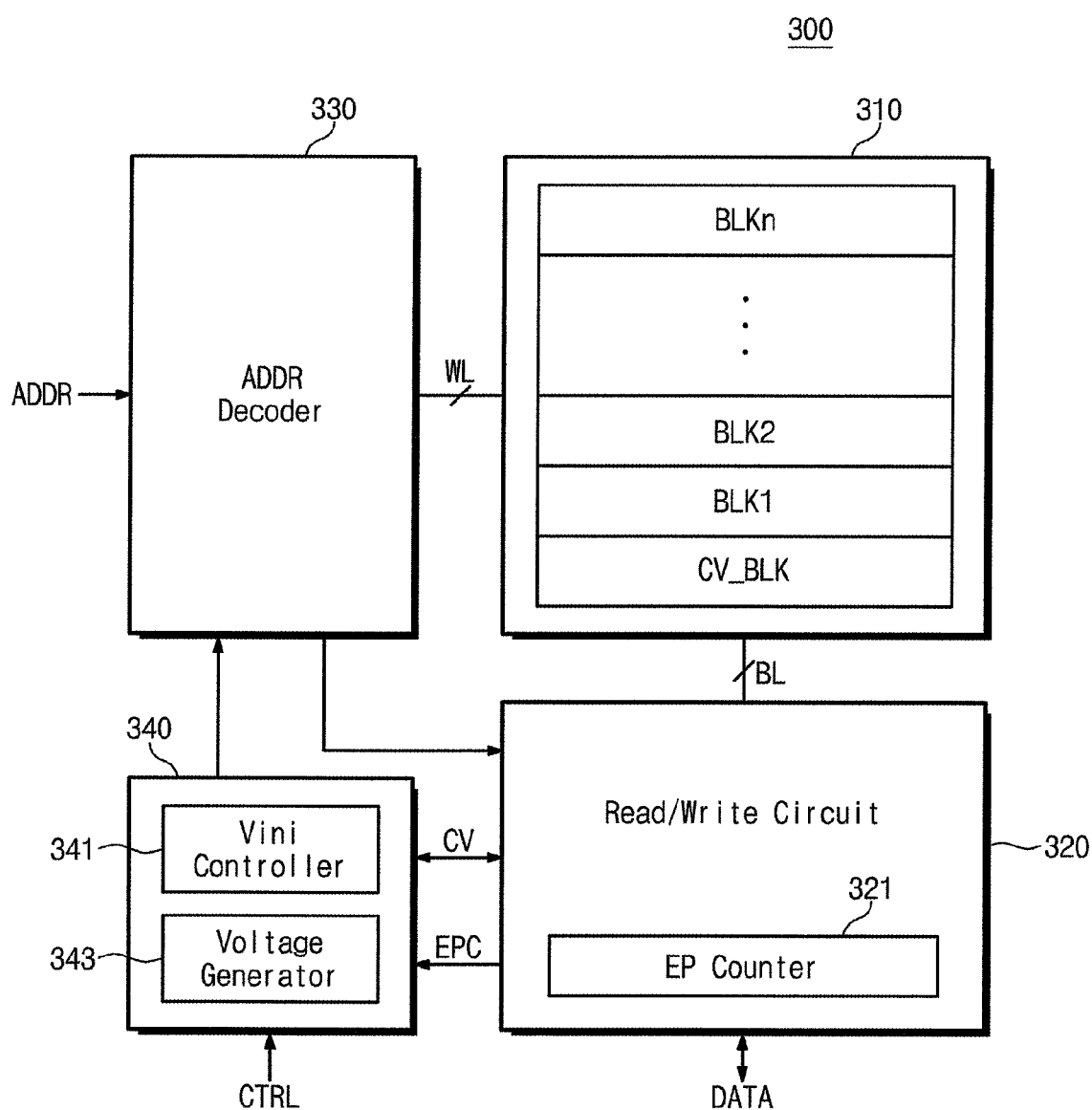
FIG. 6 is a block diagram showing a nonvolatile memory device of the memory system shown in FIG. 1, according to another embodiment of the present invention.

FIG. 6 is a block diagram showing a nonvolatile memory device 300 according to another embodiment of the invention. Referring to FIG. 6, the nonvolatile memory device 300 may include a memory cell array 310, a read/write circuit 320, an address decoder 330, and control logic 340.

The memory cell array 310 includes a storage space CV_BLK for storing a control value CV. In this embodiment, the control value CV may include a level of an erase initial voltage Vini_e and the number of erase pulses required at an erase operation. The memory cell array 310 is substantially identical to that of FIG. 2, except for the control value CV stored in the memory cell array 310, and description thereof is thus omitted for convenience.

The read/write circuit 320 includes an erase pulse counter 321, which counts the number of erase pulses applied to the memory cell array 310 during an erase operation. An erase pulse count value EPC is sent to the control logic 340. The read/write circuit 320 is substantially identical to that of FIG. 2 except for the erase pulse counter 321, and description thereof is thus omitted. As described with reference to FIG. 2, the erase pulse counter 321 is not limited to being located in read/write circuit 320. That is, it should be understood that the location of erase pulse counter 321 is not limited by this description.

The address decoder is substantially identical to that of FIG. 2, and description thereof is thus omitted.

The control logic 340 may control an overall operation of the nonvolatile memory device 300. The control logic 340 may include an initial voltage controller 341 and a voltage generator 343. The initial voltage controller 341 may control an erase initial voltage Vini_e of stepwise increasing erase pulses. The voltage generator 343 may generate erase pulses stepwise increased from the erase initial voltage Vini_e during an erase operation.

The initial voltage controller 341 is substantially identical to that shown in FIG. 3, except for storing an erase pulse count value EPC instead of a program pulse count value PPC and except for adjusting an erase initial voltage Vini_e instead of a program initial voltage Vini_p, and description thereof is thus omitted. As described with reference to FIG. 3, the initial voltage controller 341 may be formed of a control value register and a control value calculator. The initial voltage controller 341 may generate a flag signal Flag by comparing the control value CV and the erase pulse count value EPC.

Figure 7:
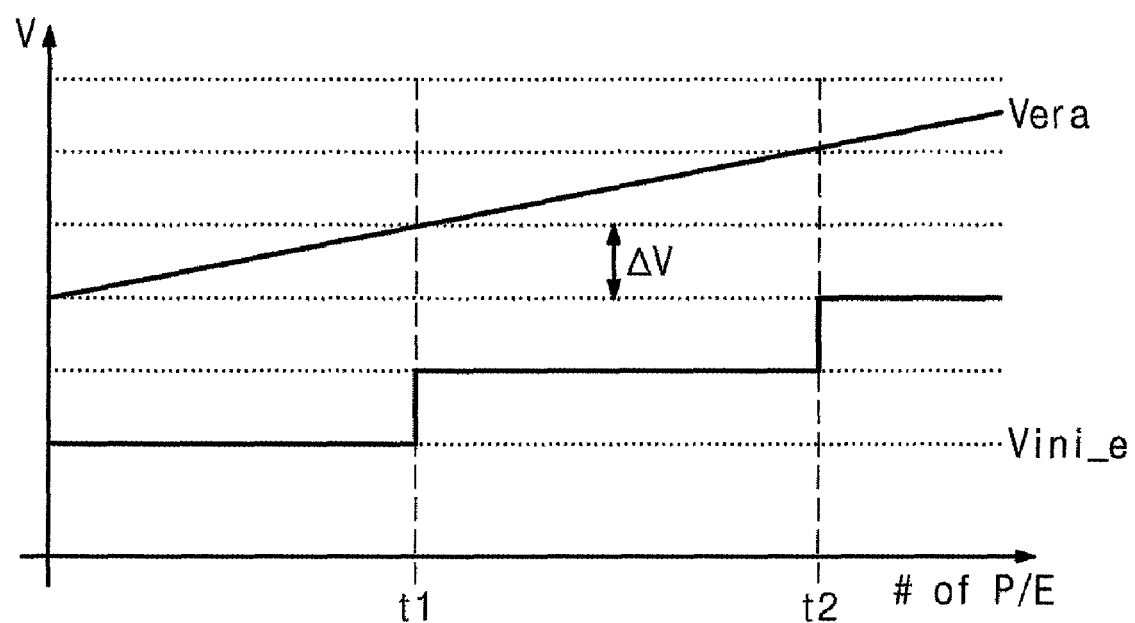
FIG. 7 is a diagram for describing operation of the nonvolatile memory device of FIG. 6.

FIG. 7 is a diagram for describing an operation of nonvolatile memory device 300 of FIG. 6. In FIG. 7, the horizontal axis indicates a program/erase number, and the vertical axis indicates a voltage. Operation of a nonvolatile memory device 300 will hereinafter be more fully described with reference to FIGS. 6 and 7.

During a program/erase operation, a nonvolatile memory device 300 may conduct a program/erase operation using stepwise increasing step pulses. As a program/erase operation is repeated, a voltage level needed for the program/erase operation may be varied. In the case of a flash memory device, the charge may be trapped at an insulating layer between a charge storing layer and a substrate. In this case, a voltage level needed for a program operation of flash memory cells is lowered, while a voltage level for an erase operation thereof is increased. Similar to the flash memory device, nonvolatile memory devices such as PRAM, RRAM, MRAM, EEPROM, etc. may suffer from variation of a voltage level needed at a program/erase operation due to deterioration of the memory cells.

The nonvolatile memory device 300 compensates for the variation of voltage level needed at a program/erase operation, the variation caused due to repetition of a program/erase operation. Operation of a nonvolatile memory device such as a flash memory device will be described hereinafter.

In FIG. 7, a line Vera indicates a voltage level needed at an erase operation, and a line Vini_e indicates an initial voltage of a stepwise increasing erase pulse. Δ V indicates an increment by which an erase pulse is increased during repetition of an erase operation. In FIG. 7, an erase initial voltage Vini_e reaches an erase voltage Vera when the erase initial voltage Vini_e is stepwise increased three times. However, it should be understood that, in general, the number of times an erase pulse is stepwise increased to reach an erase voltage is not limited to three times.

As program/erase operations are repeated over time, a level of an erase voltage Vera needed at an erase operation is gradually increased. In the case where a program/erase number reaches t1, if the erase pulse is stepwise increased four times, the erase pulse would reach the erase voltage Vera. However, if it is necessary to increase the number of erase pulses for an erase operation, a time needed to perform an erase operation may become longer. That is, an operating speed of the nonvolatile memory device 300 may be lowered.

The nonvolatile memory device 300 according to this embodiment improves operating speed by maintaining the number of erase pulses applied during erase operations. In particular, the nonvolatile memory device 300 maintains the number of erase pulses by adjusting an erase initial voltage Vini_e.

In detail, the control value calculator of the initial voltage controller 341 compares a control value CV and an erase pulse count value EPC. The control value CV may be the number of erase pulses needed at an erase operation. For simple description, it is assumed that the number of erase pulses needed at an erase operation is 3. That is, the control value CV is 3. However, it should be understood that the number of erase pulses is not limited to 3.

At t1, an erase pulse count value EPC is increased from 3 to 4. On the other hand, the control value register of initial voltage controller 341 may store 3 as the control value CV. If the erase pulse count value EPC is more than the control value CV, the control value calculator may generate a flag signal Flag. If the flag signal Flag is generated, voltage generator 343 may increase an erase initial voltage Vini_e of an erase pulse as shown at t1 in FIG. 7. In FIG. 7, the voltage generator 343 increases the erase initial voltage Vini_e by Δ V. As illustrated in FIG. 7, if an erase initial voltage Vini_e is increased at t1, the number of erase pulses applied at an erase operation is reduced from 4 to 3. That is, the number of erase pulses is maintained identically before and after t1. Thus, an operating speed of the nonvolatile memory device 300 is improved.

At t2 in FIG. 7, the number of erase pulses applied at an erase operation is increased from 3 to 4. Accordingly, the control value calculator generates a flag signal Flag, and voltage generator 343 increases the erase initial voltage Vini_e. At this time, the number of erase pulses applied at an erase operation is reduced from 4 to 3. That is, the number of erase pulses is maintained identically before and after t2. Thus, operating speed of the nonvolatile memory device 300 is improved.

The control value CV may additionally include information corresponding to the erase initial voltage Vini_e. In exemplary embodiments, the erase initial voltage Vini_e increases once from an initial level between t1 and t2. The control value CV may include information corresponding to the number increased from an initial level of the erase initial voltage Vini_e. At a power-on read operation, the control value calculator may adjust the erase initial voltage Vini_e with reference to the control value CV. If the erase initial voltage Vini_e is varied due to repetition of the program/erase operation, the control value calculator may update the control value CV stored in the control value register. Control logic 340 may also update the control value CV of a storage space in a memory cell array 310.

It should be understood that the control value CV may be stored as nonvolatile information in a control value register instead of the memory cell array 310.

The voltage generator 343 may vary the erase initial voltage Vini_e using a circuit such as a voltage trim circuit. In the case where a trim circuit for varying the erase initial voltage Vini_e stores its level as nonvolatile information using electric fuses, it would be sufficient for the control value CV to indicate the number of erase pulses needed at an erase operation. That is, information corresponding to the erase initial voltage Vini_e is not needed. In such a case, it should be understood that the control value register may be replaced with a circuit for generating a value corresponding to the number of erase pulses needed at an erase operation.

Figure 8:
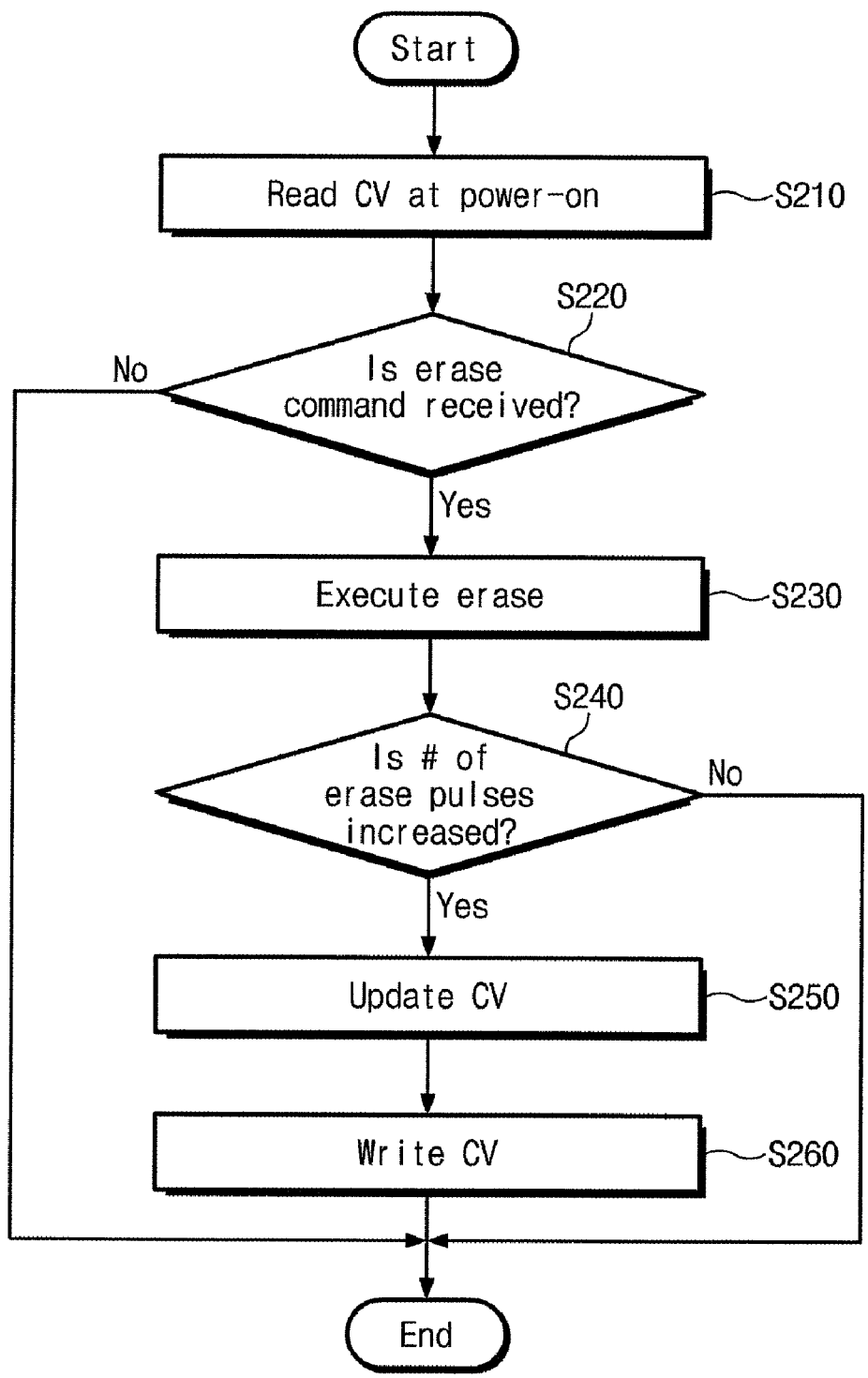
FIG. 8 is a flowchart for describing an operation of the nonvolatile memory device of FIG. 6.

FIG. 8 is a flowchart for describing an operation of a nonvolatile memory device 300 of FIG. 6. Referring to FIGS. 6 to 8, in step S210, a control value CV may be read out from memory cell array 310 during a power-on read operation. The control value CV thus read may be stored in a control value register of control logic 340.

If an erase command is input in step S220, the procedure advances to step S230, in which an erase operation is made. Initial voltage controller 341 sets up an erase initial voltage Vini_e in response to the control value CV. Voltage generator 343 generates erase pulses stepwise increased from the erase initial voltage Vini_e. At this time, erase pulse counter 321 of a read/write circuit 320 counts the number of erase pulses applied to the memory cell array 310.

In step S240, there is judged whether the number of erase pulses is increased. A control value calculator 347 compares the control value CV and an erase pulse count value EPC. If the control value CV is different from the erase pulse count value EPC, control value calculator generates a flag signal Flag.

In step S250, the control value CV is updated. Control logic 340 adjusts an erase initial voltage Vini_e in response to the flag signal Flag and updates the control value CV. The updated control value CV indicates that the erase initial voltage Vini_e is adjusted.

In step S260, the control value CV thus updated is written in the memory cell array 310. At a power-off operation, the control logic 340 may write the control value CV in the memory cell array 310. As an alternative, control logic 340 may write the control value CV in memory cell array 310 whenever it is updated.

As described above, the nonvolatile memory device 300 according to this embodiment includes memory cell array 310, voltage generator 343 for providing stepwise increasing step pulses for changing logic states of memory cells in the memory cell array 310, and control logic 340 for adjusting an initial voltage of the step pulses according to the number of step pulses. In accordance with the described embodiment, an operating speed of the nonvolatile memory device 300 is improved.

A nonvolatile memory device according to one embodiment has been described with reference to FIGS. 2 to 5, and a nonvolatile memory device according to another embodiment has been described with reference to FIGS. 6 to 8. It should however be understood that devices and methods for adjusting a program initial voltage, and devices and methods for adjusting an erase initial voltage, may be implemented in one nonvolatile memory device.

In exemplary embodiments, a read/write circuit includes a program pulse counter 221 and an erase pulse counter 321, and control logic may control program and erase initial voltages Vini_p and Vini_e using a control value CV, a program pulse count value PPC, and an erase pulse count value EPC.

It should also be understood that in an additional embodiment, nonvolatile memory device 200 may be configured to adjust both a program initial voltage Vini_p and an erase initial voltage Vini_e in response to a program pulse count value PPC. For example, if a program pulse count value PPC is changed, that is when it is reduced for example, nonvolatile memory device 200 reduces a program initial voltage Vini_p and increases an erase initial voltage Vini_e. At this time, a control value storing region/space CV_BLK may store information associated with the program and erase initial voltages Vini_p and Vini_e. An erase initial voltage controlling method of the nonvolatile memory device 200 may be carried out in the same manner as described in FIGS. 6 to 8, except that a control value CV is compared with a program pulse count value PPC instead of an erase pulse count value EPC.

It should also be understood that in a still additional embodiment, nonvolatile memory device 300 of FIG. 6 may control both a program initial voltage Vini_p and an erase initial voltage Vini_e in response to an erase pulse count value EPC. For example, if the erase pulse count value EPC is changed, that is when it is increased for example, the nonvolatile memory device 300 reduces a program initial voltage Vini_p and increases an erase initial voltage Vini_e. At this time, a control value storing space CV_BLK may store information associated with program and erase initial voltages Vini_p and Vini_e. A program initial voltage controlling method of the nonvolatile memory device 300 is carried out in the same manner as described in FIG. 2 to 5 except that a control value CV is compared with an erase pulse count value EPC instead of a program pulse count value PPC.

Figure 9:
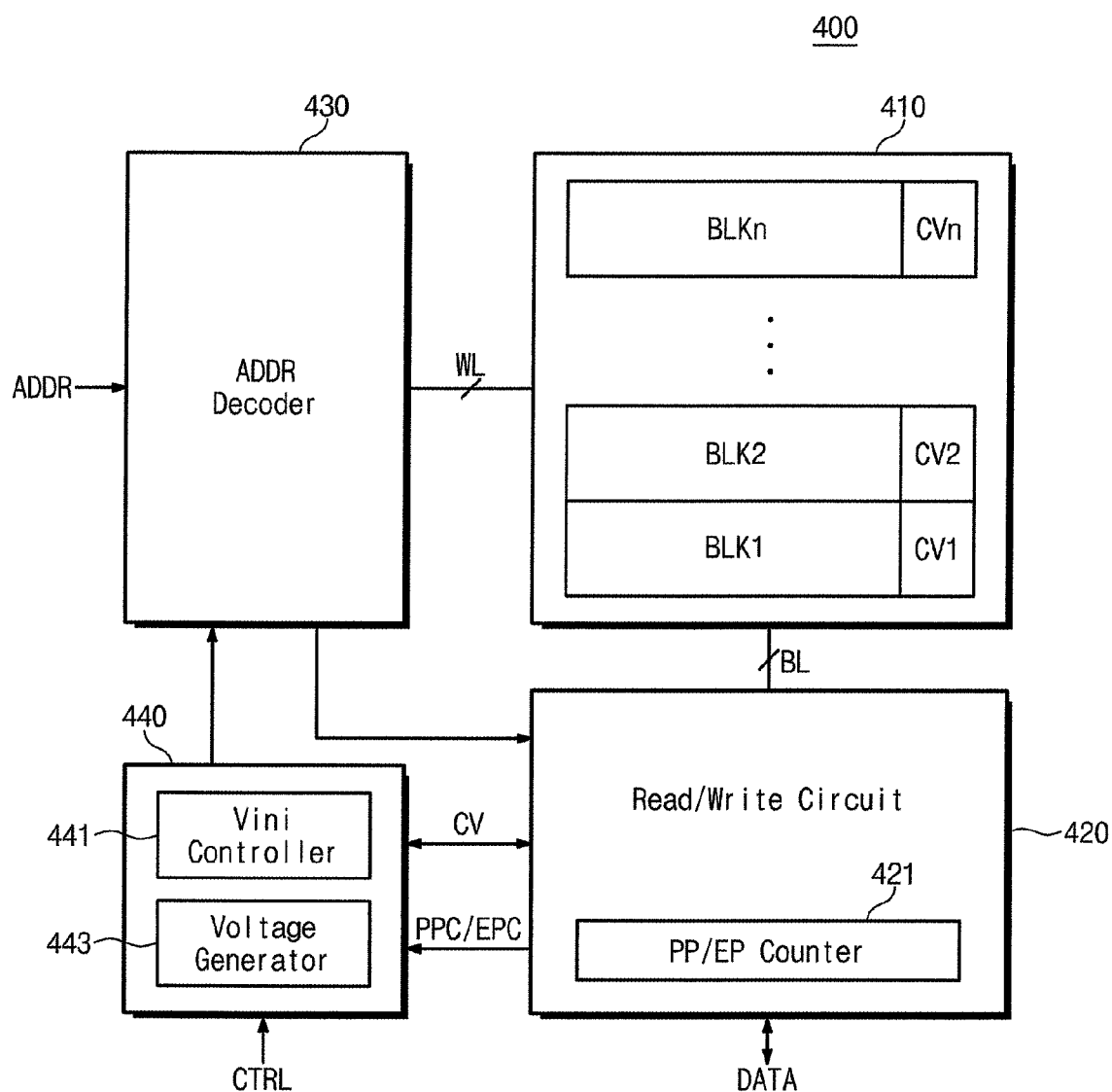
FIG. 9 is a block diagram showing a nonvolatile memory device of FIG. 1 according to a still further embodiment.

FIG. 9 is a block diagram showing a nonvolatile memory device 400 according to a still further embodiment. Referring to FIG. 9, a nonvolatile memory device 400 may include a memory cell array 410, a read/write circuit 420, an address decoder 430, and control logic 440.

The memory cell array 410 is formed of a plurality of storage regions BLK1 to BLKn. Each of plurality of storage regions BLK1 to BLKn may correspond to a memory block. In other exemplary embodiments, each of plurality of storage regions BLK1 to BLKn may correspond to a single-level storage region and a multi-level storage region. In still other exemplary embodiments, each of plurality of storage regions BLK1 to BLKn may correspond to a user data region and a meta data region. In other exemplary embodiments, each of plurality of storage regions BLK1 to BLKn may correspond to a data storage region and a code storage region.

The plurality of storage regions BLK1 to BLKn may include corresponding control value storage regions CV1 to CVn, respectively. The control value storage region CV2 may store a control value CV2 corresponding to the storage region BLK2. The control value storage region CVn may store a control value CV2 corresponding to the storage region BLKn. The control value storage regions CV1 to CVn may be spare or flag regions each corresponding to the storage regions BLK1 to BLKn, respectively.

The memory cell array 410 is substantially identical to that of FIG. 2 and FIG. 6 except for the control value storage regions CV1 to CVn, and description thereof is thus omitted.

The read/write circuit 420 may include a program/erase pulse counter 421. The program/erase pulse counter 421 may count the number of program pulses applied to the memory cell array 410 at a program operation, and the number of erase pulses applied to the memory cell array 410 at an erase operation. The read/write circuit 420 is substantially identical with that of FIGS. 2 and 6 except for the program/erase pulse counter 421, and description thereof is thus omitted.

As described with reference to FIGS. 2 and 6, the location of program/erase pulse counter 421 is not limited to the read/write circuit 420.

The address decoder 430 is substantially identical to that of FIGS. 2 and 6, and description thereof is thus omitted.

The control logic 440 may control an overall operation of the nonvolatile memory device 400. The control logic 440 may include an initial voltage controller 441 and a voltage generator 443. As described in FIGS. 2 to 5, the initial voltage controller 441 compares a program pulse count value PPC and a control value CV to control a program initial voltage Vini_p according to a comparison result. As described with reference to FIGS. 6 to 8, the initial voltage controller 441 compares an erase pulse count value EPC and a control value CV to control an erase initial voltage Vini_e according to a comparison result.

The voltage generator 443 generates program/erase pulses each having a predetermined level in response to a flag signal Flag from the initial voltage generator 441. The control logic 440 is substantially identical to that of FIGS. 2 and 6 except for the initial voltage controller 441 and the voltage generator 443, and description thereof is thus omitted.

As described with reference to FIG. 3, the initial voltage controller 441 may be formed of a control value register and a control value calculator. The control value calculator may compare control values CV1 to CVn and a program/erase pulse count value PPC/EPC to generate a flag signal Flag.

Figure 10:
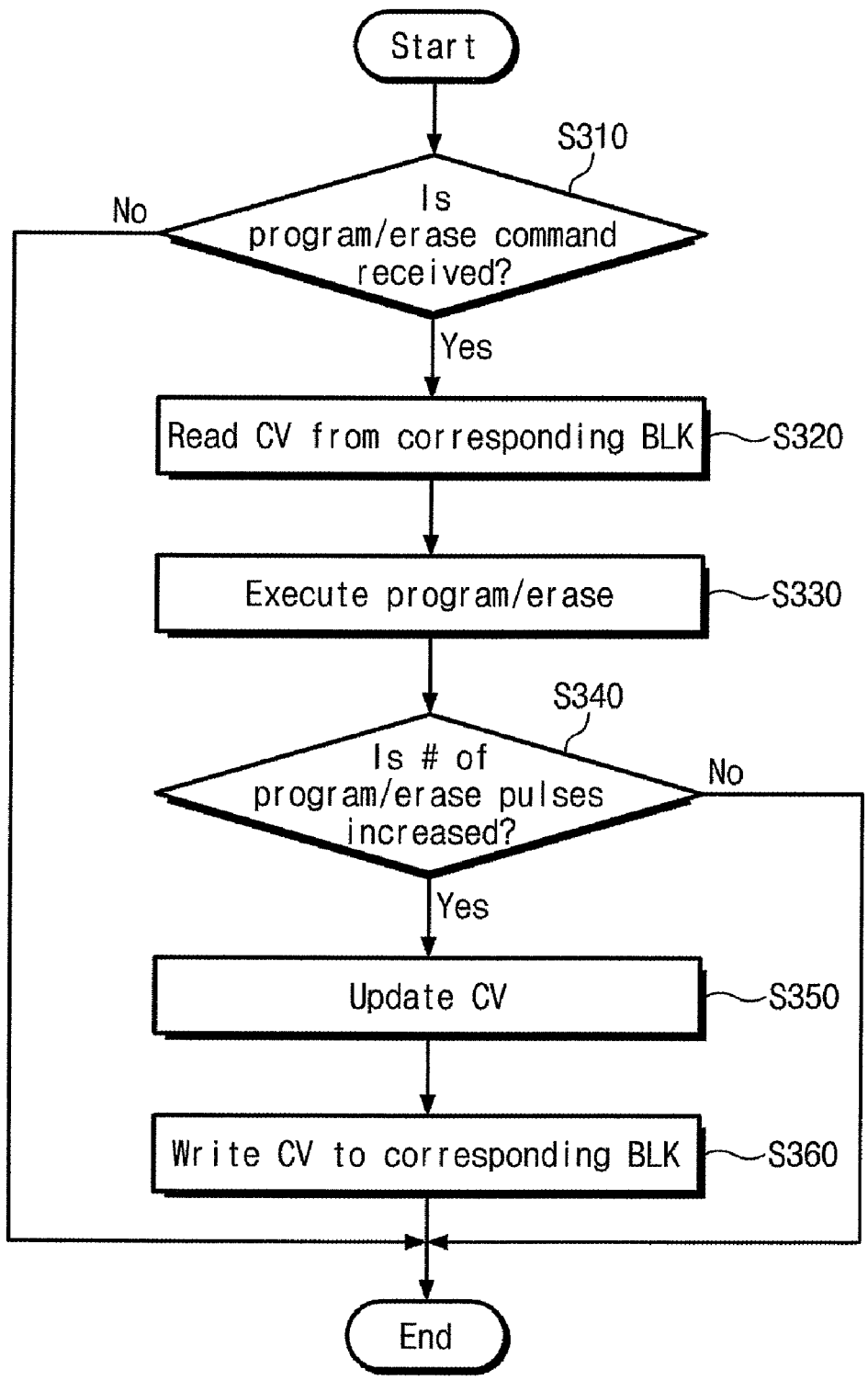
FIG. 10 is a flowchart for describing an operation of the nonvolatile memory device of FIG. 9.

FIG. 10 is a flowchart for describing an operation of a nonvolatile memory device 400 of FIG. 9. Referring to FIGS. 9 and 10, in step S310, there is judged whether a program/erase command is transferred. If a program/erase command is transferred, the procedure advances to step S320, in which read/write circuit 420 reads a control value (e.g., CV2) of a storage region (e.g., BLK2) of storage regions BLK1 to BLKn corresponding to the input program/erase command and transfers the read control value to control logic 440. The control logic 440 stores the control value CV2 sent from the read/write circuit 420 in the control value register.

If a program command is transferred at step S310, the read/write circuit 420 may read information related to a program operation from a control value storage region CV2. For example, the read/write circuit 420 may read from the control value storage region CV2 the number of program pulses needed at a program operation and information indicating whether a program initial voltage Vini_p of the storage region BLK2 is adjusted or not.

If an erase command is transferred at step S310, the read/write circuit 420 may read information, associated with an erase operation, from the control value storage region CV2 of the storage region corresponding to the erase command. For example, the read/write circuit 420 may read from the control value storage region CV2 the number of erase pulses needed at an erase operation and information indicating whether an erase initial voltage Vini_e of the storage region BLK2 is adjusted or not.

In step S330, a program/erase operation is made. The voltage generator 443 may supply the memory cell array 410 with program/erase pulses stepwise increased from the program/erase initial voltage Vini_p/Vini_e.

In step S340, there is judged whether the number of program/erase pulses is varied. The control logic 440 compares the control value CV2 in the control value register with the program/erase pulse count value PPC/EPC. If the program command is transferred in step S320 and the control value CV2 is different from the program pulse count value PPC, the control logic 440 reduces the program initial voltage Vini_p. If the erase command is transferred in step S320 and the control value CV2 is different from the erase pulse count value EPC, the control logic 440 increases the erase initial voltage Vini_e. If the number of program/erase pulses is varied, the procedure goes to step S350, in which the control value CV2 is updated. The control logic 440 may update the control value CV2 stored in the control value register.

In step S360, the control value CV2 thus updated is written in the control value storage region CV2 of the storage region BLK2 corresponding to the program/erase command. For example, the control logic 440 may write the control value CV2 in the control value storage region CV2 of the memory cell array 410 whenever the program/erase operation is carried out.

As described with reference to FIGS. 9 and 10, the nonvolatile memory device 400 includes memory cell array 410, voltage generator 443 for providing stepwise increasing step pulses for varying logic states of memory cells in the memory cell array 410, and control logic 440 for adjusting an erase/program initial voltage Vini_e/Vini_p of the stepwise increasing step pulses according to the number of the step pulses. In accordance with this embodiment, read errors of the nonvolatile memory device 400 are prevented, and operating speed is improved.

The nonvolatile memory device 400 as described above adjusts program and erase initial voltages Vini_e and Vini_p. However, it should be understood that the nonvolatile memory device 400 is capable of adjusting the program initial voltage Vini_p as described with reference to FIGS. 2 to 5 and adjusting the erase initial voltage Vini_e as described with reference to FIGS. 6 to 8.

Further, as described above, it should be understood that the nonvolatile memory device 400 of FIG. 9 is capable of controlling the program and erase initial voltages Vini_p and Vini_e in response to the program pulse count value PPC or in response to the erase pulse count value EPC.

The above-described nonvolatile memory devices 200, 300, and 400 are described to control program and erase initial voltages Vini_p and Vini_e. However, it should be understood that the nonvolatile memory devices 200, 300, and 400 are capable of adjusting voltages different from the program and erase initial voltages Vini_p and Vini_e. For example, each of the nonvolatile memory devices 200, 300, and 400 may control a voltage of a constant level such as a pass voltage Vpass. As described above, if a program/erase operation is repeated, a voltage level required for a program operation is lowered. That is, in the case that the pass voltage is maintained constantly though the program/erase operation is repeated, there is increased the influence of the program disturbance due to the pass voltage. Accordingly, it is possible to adjust a level of the pass voltage according to repetition of the program/erase operation, thus preventing the influence of the program disturbance due to the pass voltage. For example, the nonvolatile memory devices 200, 300, and 400 may control a level of the pass voltage to be lowered.

As a further example, if a program pulse count value PPC is varied (e.g., when it is lowered), the nonvolatile memory devices 200 and 400 may control the level of the pass voltage Vpass. At this time, information for the level of the pass voltage is stored in a control value storage region CV_BLK. That is, the control value CV may additionally include information related to a level of the pass voltage.

As a still further example, if an erase pulse count value EPC is varied (e.g., when it is increased), the nonvolatile memory devices 200 and 400 may control the level of the pass voltage Vpass. At this time, information for the level of the pass voltage is stored in a control value storage region CV_BLK. That is, the control value CV may additionally include information related to a level of the pass voltage.

A voltage generator 243/343/443 may generate the pass voltage using a well-known trim circuit. The voltage generator 243/343/443 may generate a controlled pass voltage Vpass in response to a control value CV.

As described above, in the case that a trim circuit for generating the pass voltage stores its level as nonvolatile information via a circuit such as an electric fuse, information for a level of the pass voltage is not included in the control value CV. Further, in the case that control logic circuits 240, 340, and 440 store information for a level of the pass voltage as nonvolatile information, information for a level of the pass voltage is not included in the control value CV.

Nonvolatile memory devices 200, 300, and 400 according to the exemplary embodiments are not limited to control a pass voltage of voltages each having a constant level. Voltages of various levels may be used at an operation of a nonvolatile memory device. For example, voltages of various levels such as a read voltage, a program inhibition voltage, a pre-charge voltage, etc. may be used at an operation of a nonvolatile memory device. It is possible to control such voltages according to repetition of a program/erase operation in the same manner as described above.

Figure 11:
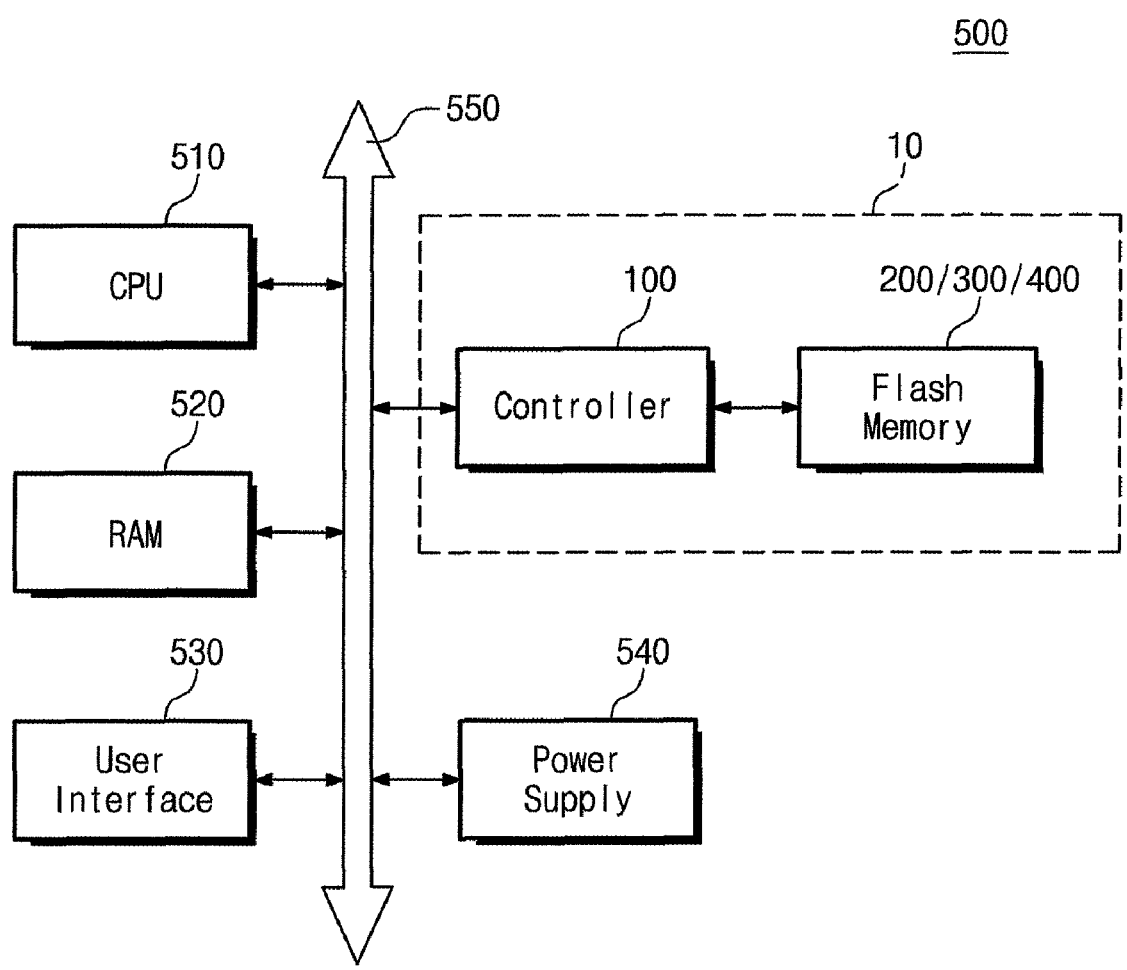
FIG. 11 is a block diagram showing a computing system including a memory system of FIG. 1.

FIG. 11 is a block diagram showing a computing system including a memory system of FIG. 1. Referring to FIG. 11, computing system 500 includes CPU 510, RAM 520, a user interface 530, a power supply 540, and a memory system 10.

The memory system 10 is electrically connected via a system bus 550 to the elements 510 to 540. The memory system 10 stores data provided via the user interface 530 or processed by the CPU 510. The memory system 10 includes a controller 100 and a nonvolatile memory device 200/300/400. In a case where the memory system 10 is installed with Solid State Disk/Drive (SSD), a booting speed of the computing system may be increased. Although not illustrated in FIG. 11, the computing system may further comprise an application chipset, camera image processor, and the like.

The above-disclosed subject matter is to be considered illustrative, and not restrictive, and the appended claims are intended to cover all such modifications, enhancements, and other embodiments, which fall within the true spirit and scope of the invention. Thus, the scope of the invention is to be determined by the broadest permissible interpretation of the following claims and their equivalents, and shall not be restricted or limited by the foregoing detailed description.

What is claimed is:

1. A nonvolatile memory device comprising:
   a memory cell array;
   a voltage generator configured to provide stepwise increasing step pulses for varying logic states of memory cells in the memory cell array; and
   a control logic configured to adjust an initial voltage of the stepwise increasing step pulses according to a number of the stepwise increasing step pulses provided.

2. The nonvolatile memory device of claim 1, wherein the stepwise increasing step pulses are program pulses, and the initial voltage is a program initial voltage.

3. The nonvolatile memory device of claim 2, wherein when the number of the program pulses is reduced, the control logic lowers the program initial voltage.

4. The nonvolatile memory device of claim 1, wherein the stepwise increasing step pulses are erase pulses, and the initial voltage is an erase initial voltage.

5. The nonvolatile memory device of claim 4, wherein when the number of the erase pulses is increased, the control logic increases the erase initial voltage.

6. The nonvolatile memory device of claim 1, wherein the control logic is configured to compare a control value and the number of the stepwise increasing step pulses, and to adjust the initial voltage according to a comparison result, the control value being the number of step pulses needed at a program/erase operation.

7. The nonvolatile memory device of claim 6, wherein the control value is stored in the memory cell array.

8. The nonvolatile memory device of claim 7, wherein the control value further comprises information corresponding to the initial voltage, and when the initial voltage is adjusted, the control logic updates the information corresponding to the initial voltage.

9. The nonvolatile memory device of claim 7, wherein the memory cell array is divided into a plurality of regions each storing a corresponding control value.

10. The nonvolatile memory device of claim 9, wherein the control logic
    reads a control value of a region of the plurality of regions, the region corresponding to an externally input address;
    compares the control value of the region and the number of the stepwise increasing step pulses;
    adjusts the initial voltage according to the comparison result; and
    updates the control value corresponding to the externally input address, according to the adjusted initial voltage.

11. The nonvolatile memory device of claim 6, wherein the control logic comprises a nonvolatile storage element for storing the control value.

12. The nonvolatile memory device of claim 11, wherein the control logic further comprises a nonvolatile storage element for storing the adjusted initial voltage.

13. The nonvolatile memory device of claim 1, wherein the control logic is further configured to adjust a pass voltage level according to the stepwise increasing step pulses.

14. An operating method of a nonvolatile memory device comprising:
    supplying memory cells with stepwise increasing step pulses for varying logic states of the memory cells;
    comparing a number of the stepwise increasing step pulses supplied for varying the logic states of the memory cells with a number of step pulses needed for an operation of the nonvolatile memory device; and
    adjusting an initial voltage of the stepwise increasing step pulses according to a comparison result.

15. The operating method of claim 14, wherein the stepwise increasing step pulses are program pulses, and the initial voltage is a program initial voltage.

16. The operating method of claim 14, wherein the stepwise increasing step pulses are erase pulses, and the initial voltage is an erase initial voltage.

17. The operating method of claim 14, further comprising adjusting a pass voltage according to the comparison result.

18. A memory system comprising:
    a nonvolatile memory device; and
    a controller configured to control the nonvolatile memory device, wherein the nonvolatile memory device includes
    a memory cell array,
    a voltage generator configured to provide stepwise increasing step pulses for varying logic states of memory cells in the memory cell array, and
    a control logic configured to adjust an initial voltage of the stepwise increasing step pulses according to a number of the stepwise increasing step pulses provided.

19. The memory system of claim 18, wherein the nonvolatile memory device and the controller are configured as a Solid State Disk/Drive.

20. The memory system of claim 18, wherein the nonvolatile memory device and the controller are configured as a memory card.

* * * * *